United States Patent
Yatsuda et al.

(10) Patent No.: US 8,641,916 B2
(45) Date of Patent: Feb. 4, 2014

(54) PLASMA ETCHING APPARATUS, PLASMA ETCHING METHOD AND STORAGE MEDIUM

(75) Inventors: Koichi Yatsuda, Nirasaki (JP); Yoshinobu Ooya, Nirasaki (JP); Shin Okamoto, Nirasaki (JP); Hiromasa Mochiki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 722 days.

(21) Appl. No.: 12/692,913

(22) Filed: Jan. 25, 2010

(65) Prior Publication Data

US 2010/0190350 A1    Jul. 29, 2010

Related U.S. Application Data

(60) Provisional application No. 61/176,524, filed on May 8, 2009.

(30) Foreign Application Priority Data

Jan. 26, 2009 (JP) ................. 2009-014254

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| H01L 21/302 | (2006.01) |
| H01L 21/461 | (2006.01) |

(52) U.S. Cl.
USPC ............... 216/67; 216/69; 438/689; 438/706; 438/710

(58) Field of Classification Search
None
See application file for complete search history.

(56) References Cited

U.S. PATENT DOCUMENTS

| | | | |
|---|---|---|---|
| 5,435,886 A | 7/1995 | Fujiwara et al. | |
| 5,928,528 A * | 7/1999 | Kubota et al. | ................ 216/67 |
| 6,423,242 B1 | 7/2002 | Kojima et al. | |
| 2007/0221493 A1* | 9/2007 | Honda et al. | ............ 204/192.1 |
| 2008/0023440 A1* | 1/2008 | Chen et al. | ................... 216/58 |

FOREIGN PATENT DOCUMENTS

| | | |
|---|---|---|
| JP | 6-61182 | 3/1994 |
| JP | 6-342769 A | 12/1994 |
| JP | 11-67741 A | 3/1999 |
| JP | 2000-173993 | 6/2000 |
| JP | 2002-50611 A | 2/2002 |
| JP | 2006-270018 A | 10/2006 |

* cited by examiner

*Primary Examiner* — Nadine Norton
*Assistant Examiner* — Stephanie Duclair
(74) *Attorney, Agent, or Firm* — Rothwell, Figg, Ernst & Manbeck, P.C.

(57) ABSTRACT

A plasma etching method for forming a hole in an etching target film by a plasma processing apparatus is provided. The apparatus includes an RF power supply for applying RF power for plasma generation to at least one of upper and lower electrodes, and a DC power supply for applying minus DC voltage to the upper electrode. A first condition that plasma is generated by turning on the RF power supply and minus DC voltage is applied to the upper electrode and a second condition that the plasma is extinguished by turning off the RF power supply and minus DC voltage is applied to the upper electrode are alternately repeated. Etching is performed by positive ions in the plasma under the first condition and negative ions are supplied into the hole by the DC voltage to neutralize positive ions in the hole under the second condition.

19 Claims, 11 Drawing Sheets

BIAS OUTPUT = FIRST OUTPUT (HIGH OUTPUT)

FIG. 10B

BIAS OUTPUT = SECOND OUTPUT (0 OR LOW OUTPUT)

FIG.11A

<BIAS ON>

FIG.11B

<BIAS ON>

FIG. 12A

<BIAS OFF>

FIG. 12B

<BIAS OFF>

PLASMA ETCHING APPARATUS, PLASMA ETCHING METHOD AND STORAGE MEDIUM

FIELD OF THE INVENTION

The present invention relates to a plasma etching method for performing a plasma etching process on a target substrate such as a semiconductor substrate, a plasma etching apparatus and a storage medium.

BACKGROUND OF THE INVENTION

In a manufacturing process of semiconductor devices, a plasma etching process using a resist as a mask is widely used in order to form predetermined patterns in specific layers formed on a semiconductor wafer serving as a target substrate.

Various types of plasma etching apparatuses are used to perform the plasma etching process. Conventionally, a capacitively coupled parallel plate type plasma etching apparatus is mainly used.

In the capacitively coupled parallel plate type plasma etching apparatus, a pair of parallel plate electrodes (upper and lower electrodes) is disposed in a chamber. While a processing gas is introduced into the chamber, an RF power is applied to at least one of the electrodes to form an RF electric field between the electrodes, thereby generating a plasma of the processing gas. Accordingly, a plasma etching process is performed on specific layers of the semiconductor wafer.

Specifically, there is a plasma etching apparatus in which an appropriate plasma state is formed by applying an RF power for plasma generation having a relatively high frequency and an RF power for ion attraction having a relatively low frequency, thereby performing an etching process with high selectivity and high reproducibility (see, e.g., Japanese Patent Application Publication No. 2000-173993). In such a case, the etching process is performed by using a plasma of a processing gas in which positive ions act as dominant ions.

The recent trend of miniaturization of semiconductor devices requires High Aspect Ratio Contact (HARC) etching to obtain an aspect ratio of 20 or more. In the HARC etching, a photoresist serving as an etching mask is negatively charged and charges are neutralized on a surface to be etched at an initial step of the etching. However, when the aspect ratio increases as the etching proceeds, positive ions are accumulated at the bottom of a hole and the surface to be etched is positively charged. Accordingly, the travel direction of positive ions accelerating the etching is bent a repulsive force between the positive ions in the hole to thereby cause distortion of etched profiles. Further, less positive ions reach the bottom of the hole, thereby reducing an etching rate.

SUMMARY OF THE INVENTION

In view of the above, the present invention provides a plasma etching method for forming a hole having a high aspect ratio by etching a target film in a good shape at a high etching rate and a plasma etching apparatus.

Further, the present invention provides a storage medium storing a program for performing the plasma etching method.

In accordance with a first aspect of the present invention, there is provided a plasma etching method for forming a hole in an etching target film by using a plasma processing apparatus, which includes a vacuum evacuable processing chamber accommodating an object to be processed; a lower electrode disposed in the processing chamber and serving as a mounting table on which the object is mounted; an upper electrode disposed in the processing chamber to face the lower electrode; a processing gas supply unit for supplying a processing gas into the processing chamber; an RF power supply for applying an RF power for plasma generation to at least one of the upper electrode and the lower electrode; and a DC power supply for applying a minus DC voltage to the upper electrode. A first condition that a plasma is generated in the processing chamber by turning on the RF power supply and a minus DC voltage is applied to the upper electrode from the DC power supply and a second condition that the plasma is extinguished in the processing chamber by turning off the RF power supply and a minus DC voltage is applied to the upper electrode from the DC power supply are alternately repeated. Further, an etching process is performed by positive ions in the plasma under the first condition and negative ions are produced and supplied into the hole by the DC voltage to neutralize positive ions in the hole under the second condition.

In accordance with a second aspect of the present invention, there is provided a plasma etching method for forming a hole in an etching target film by using a plasma processing apparatus, which includes a vacuum evacuable processing chamber accommodating an object to be processed; a lower electrode disposed in the processing chamber and serving as a mounting table on which the object is mounted; an upper electrode disposed in the processing chamber to face the lower electrode; a processing gas supply unit for supplying a processing gas into the processing chamber; an RF power supply for applying an RF power for plasma generation to at least one of the upper electrode and the lower electrode; and a DC power supply for applying a minus DC voltage to the upper electrode. The method comprises a first step of continuously supplying an RF power from the RF power supply to generate a plasma in the processing chamber and applying a minus DC voltage to the upper electrode from the DC power supply; and a second step of alternately repeating a first condition that a plasma is generated in the processing chamber by turning on the RF power supply and a minus DC voltage is applied to the upper electrode from the DC power supply and a second condition that the plasma is extinguished in the processing chamber by turning off the RF power supply and a minus DC voltage is applied to the upper electrode from the DC power supply. In the second step, an etching process is performed by positive ions in the plasma under the first condition and negative ions are produced and supplied into the hole by the DC voltage to neutralize positive ions in the hole under the second condition.

In accordance with a third aspect of the present invention, there is provided a plasma etching apparatus comprising: a vacuum evacuable processing chamber accommodating an object to be processed; a lower electrode disposed in the processing chamber and serving as a mounting table on which the object is mounted; an upper electrode disposed in the processing chamber to face the lower electrode; a processing gas supply unit for supplying a processing gas into the processing chamber; an RF power supply for applying an RF power for plasma generation to at least one of the upper electrode and the lower electrode; a DC power supply for applying a minus DC voltage to the upper electrode; and a controller for controlling the RF power supply. The controller controls the RF power supply such that a first condition that a plasma is generated in the processing chamber by turning on the RF power supply and a minus DC voltage is applied to the upper electrode from the DC power supply and a second condition that the plasma is extinguished in the processing chamber by turning off the RF power supply and a minus DC voltage is applied to the upper electrode from the DC power supply are alternately repeated. An etching process is performed by positive ions in the plasma under the first condition and negative ions are produced and supplied into the hole by the DC voltage to neutralize positive ions in the hole under the second condition.

In accordance with a fourth aspect of the present invention, there is provided a storage medium storing a program which runs on a computer and, when executed, controls a plasma processing apparatus to perform the plasma etching method of the first or second aspect. The apparatus includes a vacuum evacuable processing chamber accommodating an object to be processed; a lower electrode disposed in the processing chamber and serving as a mounting table on which the object is mounted; an upper electrode disposed in the processing chamber to face the lower electrode; a processing gas supply unit for supplying a processing gas into the processing chamber; an RF power supply for applying an RF power for plasma generation to at least one of the upper electrode and the lower electrode; and a DC power supply for applying a minus DC voltage to the upper electrode.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Figure 1:
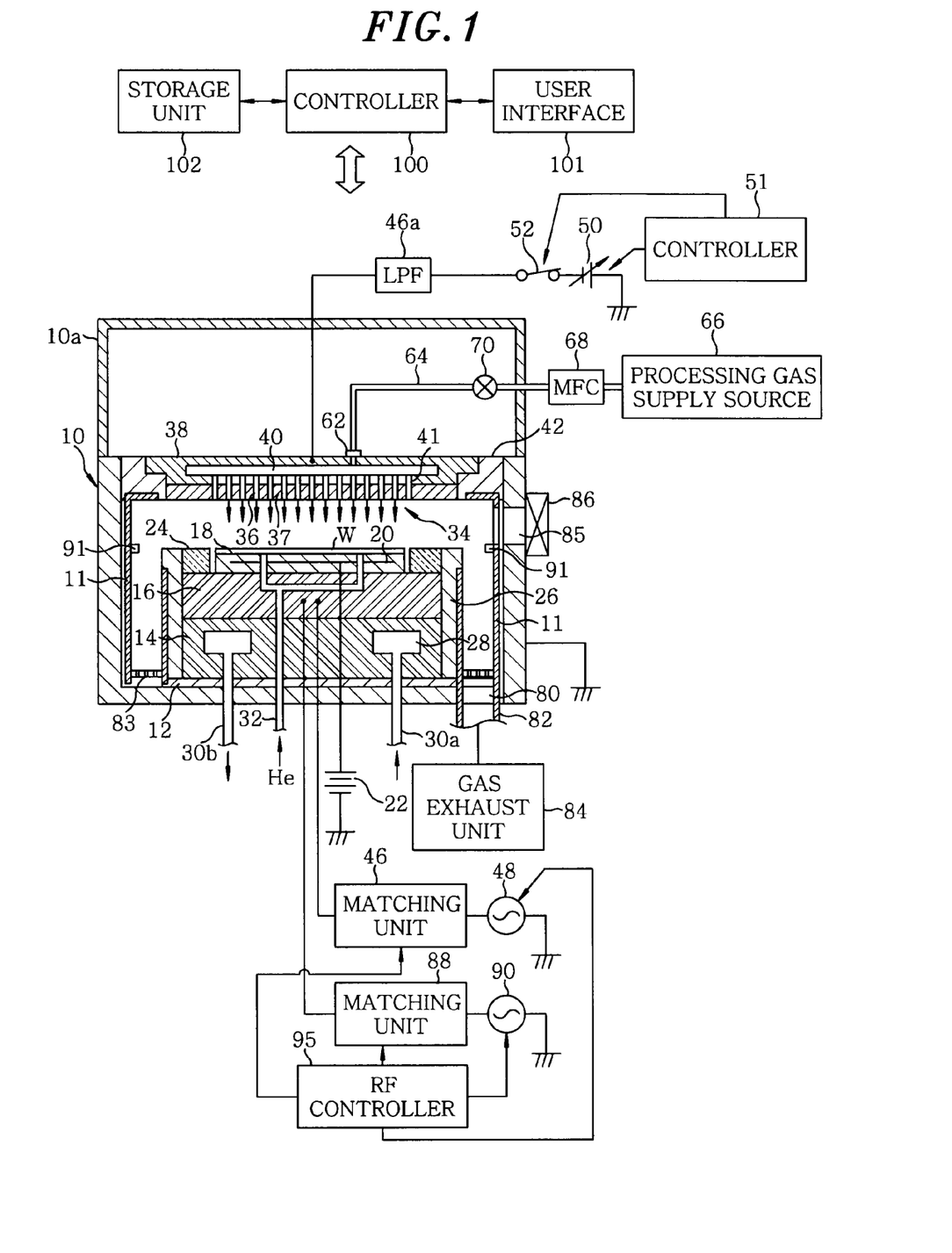
FIG. 1 is a cross sectional view schematically showing a plasma etching apparatus for performing a plasma etching method in accordance with a first embodiment of the present invention.

FIG. 1 is a cross sectional view schematically showing a plasma etching apparatus for performing a plasma etching method in accordance with a first embodiment of the present invention.

The plasma etching apparatus is configured as a capacitively coupled parallel plate type plasma etching apparatus. The plasma etching apparatus has an approximately cylindrical chamber (processing chamber) 10 made of, e.g., aluminum whose surface is anodically oxidized, and the chamber 10 is frame grounded.

A cylindrical susceptor support 14 is provided at a bottom portion in the chamber 10 via an insulation plate 12 made of ceramic or the like. Further, a susceptor 16 made of, e.g., aluminum is disposed on the susceptor support 14. The susceptor 16 serves as a lower electrode and a target substrate, e.g., a semiconductor wafer W, is mounted thereon.

On the top surface of the susceptor 16, there is disposed an electrostatic chuck 18 for attracting and holding the semiconductor wafer W with an electrostatic adsorptive force. The electrostatic chuck 18 includes an electrode 20 formed of a conductive film which is inserted between a pair of insulating layers or sheets. A DC power supply 22 is electrically connected to the electrode 20. The electrostatic chuck 18 is allowed to attract and hold the semiconductor wafer W thereon with an electrostatic force such as a Coulomb force generated by a DC voltage applied from the DC power supply 22 thereto.

A conductive focus ring (calibration ring) 24 made of, e.g., silicon is disposed on the susceptor 16 to surround the electrostatic chuck 18 (semiconductor wafer W) to improve an etching uniformity. Further, a cylindrical inner wall member 26 made of, e.g., quartz is attached to the side surfaces of the susceptor 16 and the susceptor support 14.

A coolant path 28 is, e.g., circumferentially provided inside the susceptor support 14. A coolant, e.g., cooling water, of a specific temperature is supplied into and circulated along the coolant path 28 from an external chiller unit (not shown) via pipes 30a and 30b. Accordingly, the processing temperature of the semiconductor wafer W on the susceptor 16 can be controlled by the temperature of the coolant.

Further, a heat transfer gas, e.g., He gas, is supplied into a gap between the top surface of the electrostatic chuck 18 and the backside of the semiconductor wafer W from a heat transfer gas supply unit (not shown) via a gas supply line 32.

An upper electrode 34 is provided above the susceptor (lower electrode) 16 to face the susceptor 16 in parallel. A plasma generation space is formed between the upper electrode 34 and the lower electrode 16. The surface (i.e., facing surface) of the upper electrode 34 facing the semiconductor wafer W on the susceptor (lower electrode) 16 is in contact with the plasma generation space.

The upper electrode 34 is supported by an insulating shield member 42 at an upper portion of the chamber 10. The upper electrode 34 includes an electrode plate 36 facing the susceptor 16 and having a plurality of gas discharge holes 37 and an electrode holder 38 for detachably holding the electrode plate 36, the electrode holder 38 having a water-cooling structure and being made of a conductive material, e.g., aluminum. The electrode plate 36 is preferably made of a semiconductor or a conductor having a low resistance and generating low Joule heat. Further, the electrode plate 36 is preferably made of a silicon-containing material (e.g., silicon or SiC) to strengthen a resist as will be described later. A gas diffusion space 40 is provided in the electrode holder 38. A plurality of gas flow holes 41 extend downward from the gas diffusion space 40 to communicate with the gas discharge holes 37.

A gas inlet port 62 is formed in the electrode holder to introduce a processing gas into the gas diffusion space 40. A gas supply line 64 is connected to the gas inlet port 62, and a processing gas supply source 66 is connected to the gas supply line 64. The gas supply line 64 is provided with a mass flow controller (MFC) 68 and a switching valve 70 arranged in order from the upstream side. The MFC 68 may be replaced with a flow rate control system (FCS).

Further, a processing gas for etching, e.g., a fluorocarbon (CxFy) gas such as $C_4F_8$ gas, is supplied from the processing gas supply source 66 into the gas diffusion space 40 via the gas supply line 64. The processing gas supplied into the gas diffusion space 40 is discharged into the plasma generation space in a shower shape through the gas flow holes 41 and the gas discharge holes 37. That is, the upper electrode 34 functions as a shower head for supplying the processing gas.

A variable DC power supply 50 is electrically connected to the upper electrode 34 via a low pass filter (LPF) 46a. A cathode of the variable DC power supply 50 is connected directly to the upper electrode 34, and a minus voltage is applied to the upper electrode 34. The power feed of the variable DC power supply 50 can be on-off controlled by an on/off switch 52. The current and voltage of the variable DC power supply 50 and the on/off operation of the on/off switch 52 are controlled by a controller 51. The LPF 46a serves to trap RF (high frequency) powers from first and second RF power supplies to be described later. The LPF 46a preferably includes an LR filter or an LC filter.

A cylindrical ground conductor 10a extends upward from a sidewall of the chamber 10 to be located at a vertical position higher than the upper electrode 34.

A first RF power supply 48 is electrically connected via a first matching unit 46 to the susceptor 16 serving as the lower electrode. The first RF power supply 48 outputs an RF power having a frequency of 27 to 100 MHz, e.g., 40 MHz. The first matching unit 46 matches a load impedance to an internal (or output) impedance of the first RF power supply 48. The first matching unit 46 serves to render the output impedance of the first RF power supply 48 and the load impedance be seemingly matched to each other when a plasma is generated in the chamber 10.

Further, a second RF power supply 90 is also electrically connected to the susceptor 16 serving as the lower electrode via a second matching unit 88. When an RF power is supplied from the second RF power supply 90 to the susceptor 16 serving as the lower electrode, a bias is applied to the semiconductor wafer W and, thus, ions are attracted to the semiconductor wafer W. The second RF power supply 90 outputs an RF power having a frequency of 400 kHz to 13.56 MHz, e.g., 3 MHz. The second matching unit 88 matches a load impedance to an internal (or output) impedance of the second RF power supply 90. The second matching unit 88 serves to render the internal impedance of the second RF power supply 90 and the load impedance be seemingly matched to each other when a plasma is generated in the chamber 10.

An RF controller 95 is connected to the first RF power supply 48, the second RF power supply 90, the first matching unit 46 and the second matching unit 88. The first RF power supply 48, the second RF power supply 90, the first matching unit 46 and the second matching unit 88 are controlled by the RF controller 95. Specifically, the RF controller 95 can control the on/off operation and output of the first RF power supply 48. The RF controller 95 may continuously turn on the first RF power supply 48 to generate a plasma and alternately turn on and off the first RF power supply 48 to alternately form a plasma-on state and a plasma-off state, e.g., in a pulse shape.

Further, the RF controller 95 can control the on/off operation and output of the second RF power supply 90 for bias application. The RF controller 95 may continuously apply a bias at a predetermined output level during a plasma process and control the output of the second RF power supply 90, e.g., in a pulse shape, in synchronization with the on/off operation of the first RF power supply 48. When the output of the second RF power supply 90 is controlled in synchronization with the on/off operation of the first RF power supply 48, the second RF power supply 90 may be alternately turned on and off or may be controlled to alternately have a high output level and a low output level.

Figure 2:
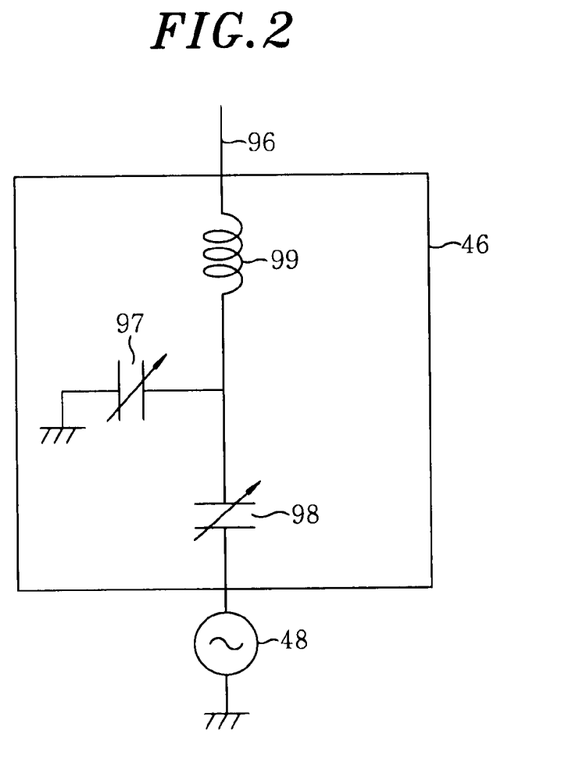
FIG. 2 illustrates a first matching unit connected to a first RF power supply in the plasma etching apparatus of FIG. 1.

The first matching unit 46 includes, as shown in FIG. 2, a first variable capacitor 97 provided in a line branched off from a power feed line 96 of the first RF power supply 48, and a second variable capacitor 98 and a coil 99 provided in the power feed line 96 at opposite sides of the branch point, the second variable capacitor 98 being on the side of the first RF power supply 48. In this embodiment, in a different way from typical plasma etching, the RF controller 95 controls the matching operation of the first matching unit 46 in synchronization with the on/off operation of the first RF power supply 48 when the first RF power supply 48 is turned on and off at specific periods.

In this case, when the first RF power supply 48 operates in on and off modes, the RF controller 95 controls the first matching unit 46 not to operate in an off mode. Further, in an on mode, the RF controller 95 controls the operation of the first matching unit 46 such that the internal impedance of the first RF power supply 48 is matched to the load impedance including the plasma in the chamber 10.

The second matching unit 88 is basically configured as the first matching unit 46. When the output of the second RF power supply 90 is controlled in synchronization with the on/off operation of the first RF power supply 48, the RF controller 95 controls the matching operation of the second matching unit 88 in synchronization with the output control of the second RF power supply 90.

In this case, the RF controller 95 controls the second matching unit 88 not to operate when the output of the second RF power supply 90 is controlled in synchronization with the on/off operation of the first RF power supply 48. However, when the operation of the second matching unit 88 is sufficiently fast, the RF controller 95 may control the second matching unit 88 to operate such that the internal impedance of the second RF power supply 90 is matched to the load impedance including the plasma in the chamber 10 at a high output level.

A gas exhaust port 80 is provided at a bottom portion of the chamber 10, and a gas exhaust unit 84 is connected to the gas exhaust port 80 through a gas exhaust pipe 82. The gas exhaust unit 84 has a vacuum pump such as a turbo-molecular pump, and can depressurize the inside of the chamber 10 to a desired vacuum level. Further, a loading/unloading port 85, through which the semiconductor wafer W is loaded and unloaded, is provided at the sidewall of the chamber 10. The loading/unloading port 85 can be opened and closed by a gate valve 86.

Further, a deposition shield 11 is detachably provided on the inner wall of the chamber 10 so as to prevent etching byproducts (deposits) from being adhered to the chamber 10. That is, the deposition shield 11 serves as a chamber wall. The deposition shield 11 is also provided on the outer surface of the inner wall member 26. A gas exhaust plate 83 is provided at the bottom portion of the chamber 10 between the deposition shield 11 provided on the inner wall of the chamber 10 and the deposition shield 11 provided around the inner wall member 26. The deposition shield 11 and the gas exhaust plate 83 may be formed of an aluminum material covered with ceramic such as $Y_2O_3$.

A conductive member (GND block) 91 DC-connected to the ground is provided at a portion of the deposition shield 11 forming the inner wall of the chamber at a height substantially equal to the height of the wafer W. With this configuration, an abnormal discharge can be prevented. Further, the position of the conductive member 91 is not limited to the position shown in FIG. 1 if it is disposed in the plasma generation space. For example, the conductive member 91 may be provided at the susceptor 16, e.g., around the susceptor 16, and may be provided at the upper electrode 34, e.g., in a ring shape on the outside of the upper electrode 34.

Each component (e.g., a power supply system, a gas supply system, a driving system, and particularly, the RF controller 95) of the plasma processing apparatus is connected to and controlled by a controller 100 including a microprocessor (computer) for controlling the whole components. Further, a user interface 101 is connected to the controller 100, and the user interface 101 includes, e.g., a keyboard for an operator to input commands to operate the plasma processing apparatus, a display for displaying an operation status of the plasma processing apparatus and the like.

Further, the controller 100 is connected to a storage unit 102 for storing therein control programs for implementing various processes in the plasma processing apparatus under the control of the controller 100 and/or programs (process recipes) for implementing processes in the components of the plasma processing apparatus in accordance with process conditions. The process recipes are stored in a storage medium of the storage unit 102. The storage medium may be a hard disk, a semiconductor memory, or a portable storage medium such as a CD-ROM, a DVD, a flash memory and the like. Further, the recipes may be transmitted from another apparatus via, e.g., a dedicated line.

If necessary, a certain process recipe is retrieved from the storage unit 102 in accordance with an instruction inputted through the user interface 101 and transmitted to the controller 100, so that a desired process is performed in the plasma processing apparatus under the control of the controller 100. Further, the plasma processing apparatus (plasma etching apparatus) in accordance with the embodiment of the present invention includes the controller 100.

Hereinafter, there will be described etching of a contact hole having a high aspect ratio (HARC etching) using the plasma processing apparatus in accordance with the embodiment of the present invention.

Figure 3:
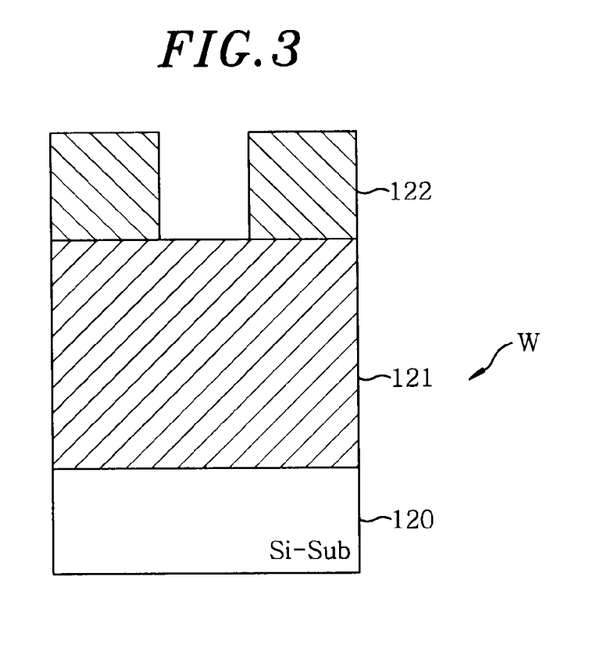
FIG. 3 illustrates a structure of a semiconductor wafer serving as an object to be processed in the plasma etching method in accordance with the embodiment of the present invention.

In this case, for example, a semiconductor wafer W shown in FIG. 3 is prepared. The semiconductor wafer W includes an insulating film 121 formed on an Si substrate 120 and a photoresist film 122 patterned by photolithography and formed as an etching mask on the insulating film 121. HARC etching is performed on the insulating film 121.

First, the gate valve 86 is opened, and the semiconductor wafer W is loaded into the chamber 10 through the loading/unloading port 85 and mounted on the susceptor 16. While the chamber 10 is evacuated by the gas exhaust unit 84, a processing gas is supplied at a predetermined flow rate from the processing gas supply source 66 to the gas diffusion space 40 and, then, supplied into the chamber 10 through the gas flow holes 41 and the gas discharge holes 37. At this time, an inner pressure of the chamber 10 is set to range, e.g., from 0.1 to 150 Pa.

In this state, an RF power for plasma generation, having a relatively high frequency of 27 to 100 MHz, e.g., 40 MHz, is applied to the susceptor 16 serving as the lower electrode from the first RF power supply 48. Further, an RF power for ion attraction, having a frequency of 400 kHz to 13.56 MHz, e.g., 3 MHz, which is lower than that of the RF power for plasma generation, is continuously applied to the susceptor 16 from the second RF power supply 90. Further, a specific DC voltage is continuously applied to the upper electrode 34 from the variable DC power supply 50. Accordingly, a first step of etching is performed on the semiconductor wafer W. At this time, the semiconductor wafer W is held on the electrostatic chuck 18 by applying a DC voltage to the electrode 20 of the electrostatic chuck 18 from the DC power supply 22.

In this case, various conventionally used gases may be employed as a processing gas. A halogen containing gas, e.g., a fluorocarbon (CxFy) gas such as $C_4F_8$ gas, may be appropriately used as a processing gas. Further, the processing gas may contain Ar gas or $O_2$ gas.

The processing gas discharged through the gas discharge holes 37 formed in the electrode plate 36 of the upper electrode 34 is converted into a plasma in glow discharge generated between the upper electrode 34 and the susceptor 16 serving as the lower electrode by RF power application. The insulating film 121 of the semiconductor wafer W is etched by positive ions or radicals produced in the plasma.

In this case, the plasma can be generated at a region closer to the wafer by applying the RF power for plasma generation to the lower electrode. Further, the plasma does not diffuse to a wider area and dissociation of the processing gas can be prevented. Accordingly, even though an inner pressure of the chamber 10 is high and the plasma density is low, an etching rate can be increased. Further, relatively high ion energy can be ensured even though the RF power for plasma generation has a high frequency and, thus, high efficiency can be obtained.

Further, in the embodiment of the present invention, it is possible to independently control plasma generation and ion attraction for plasma etching by applying the RF power for plasma generation and the RF power for ion attraction to the lower electrode, respectively. Accordingly, it is possible to satisfy etching conditions required for microprocessing. Further, the RF power having a high frequency equal to or greater than 27 MHz is supplied for plasma generation. Accordingly, the plasma can be formed in high density in a desired state and a high density plasma can be generated under low pressure conditions. Further, when the plasma is formed, a minus DC voltage is applied to the upper electrode 34 from the variable DC power supply 50 by the controller 51. Accordingly, positive ions in the plasma collide with the upper electrode 34 to produce secondary electrons in the vicinity thereof and the secondary electrons can be accelerated vertically downward and supplied to the semiconductor wafer W serving as an object to be processed.

Figure 4:
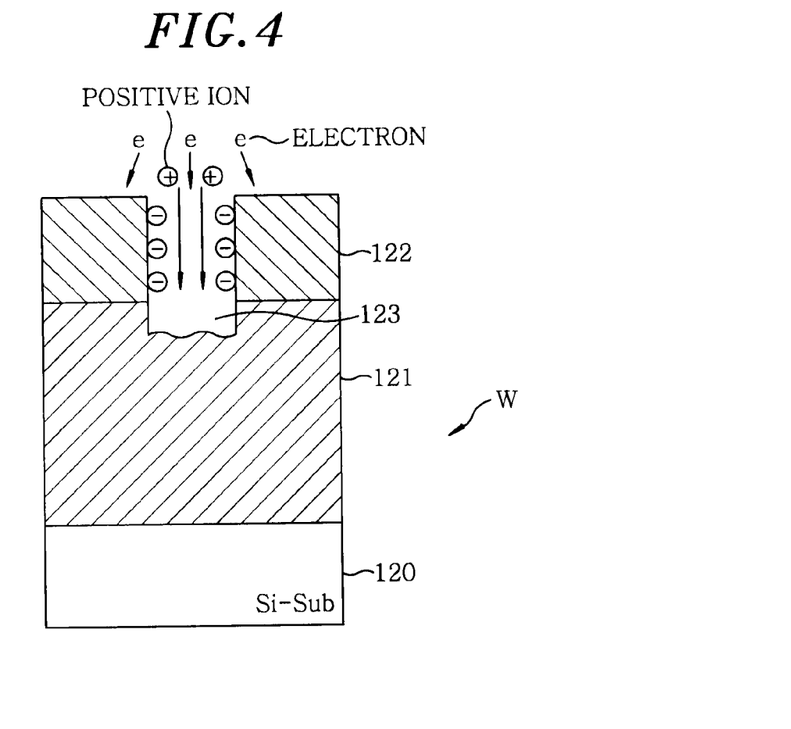
FIG. 4 is a cross sectional view schematically showing the state of the object in an initial step of etching.

The etching is performed by the plasma in which positive ions act as dominant ions. However, at an initial step of etching, a contact hole 123 formed by etching is shallow. Further, as shown in FIG. 4, the photoresist film 122 is negatively charged by electrons in the plasma reaching the surface to be etched. Accordingly, even though positive ions are supplied to the surface to be etched, charges are neutralized. Thus, etching is normally performed.

Figure 5:
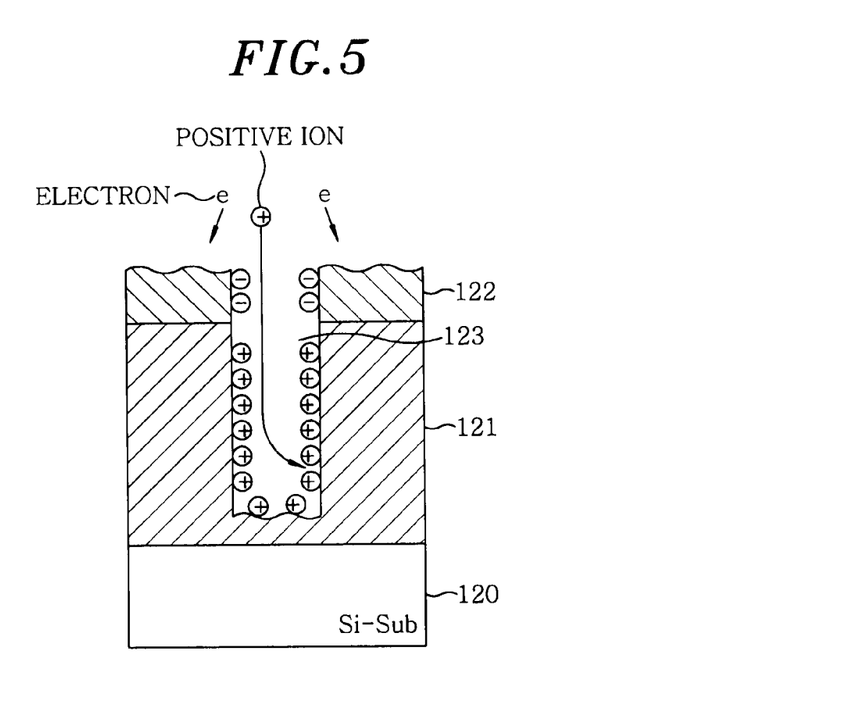
FIG. 5 is a cross sectional view schematically showing the state of the object when the etching is performed.

However, as etching proceeds, as shown in FIG. 5, when an aspect ratio of the contact hole 123 becomes high, less electrons enter into the contact hole 123 and positive ions are accumulated in the contact hole 123. Accordingly, the surface to be etched is positively charged.

When the etching is continued in this state, the travel direction of positive ions entering into the contact hole 123 for etching is bent by a repulsive force between the positive ions entering into the contact hole 123 and the positive ions accumulated in the contact hole 123, thereby causing distortion of etched profiles. Further, less positive ions reach the bottom of the hole and, thus, the etching rate is reduced.

Accordingly, after etching is performed to some extent, while the DC voltage is continuously applied from the variable DC power supply 50, the first RF power supply 48 for plasma generation is alternately turned on and off. Accordingly, a second step of etching is performed to alternately repeat a plasma generation state (plasma on) and a plasma extinction state (plasma off).

Figure 6:
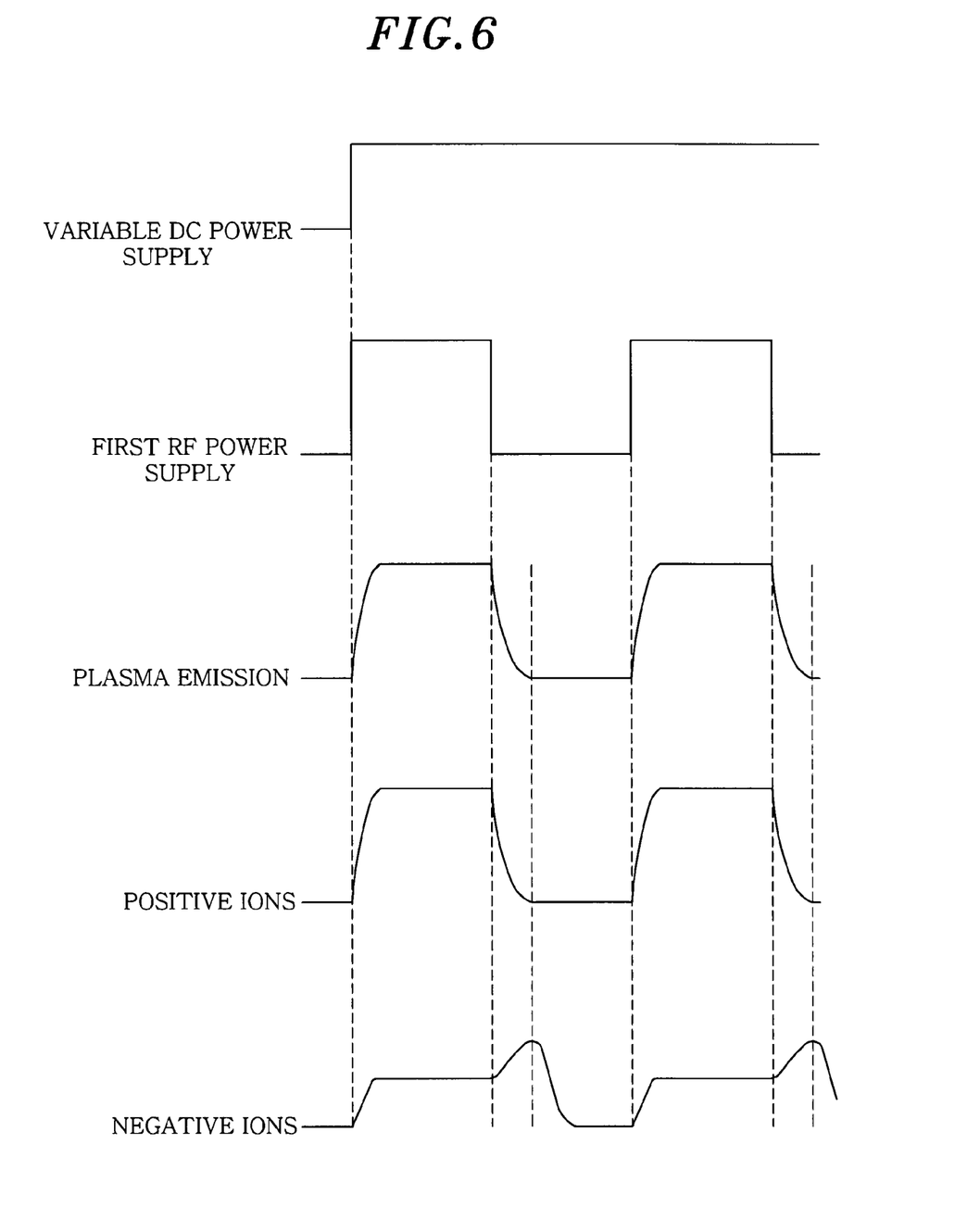
FIG. 6 illustrates timing charts showing states of a DC power supply, a first RF power supply, plasma emission intensity, positive ions and negative ions in a second step of the plasma etching method in accordance with the embodiment of the present invention.
Figure 7:
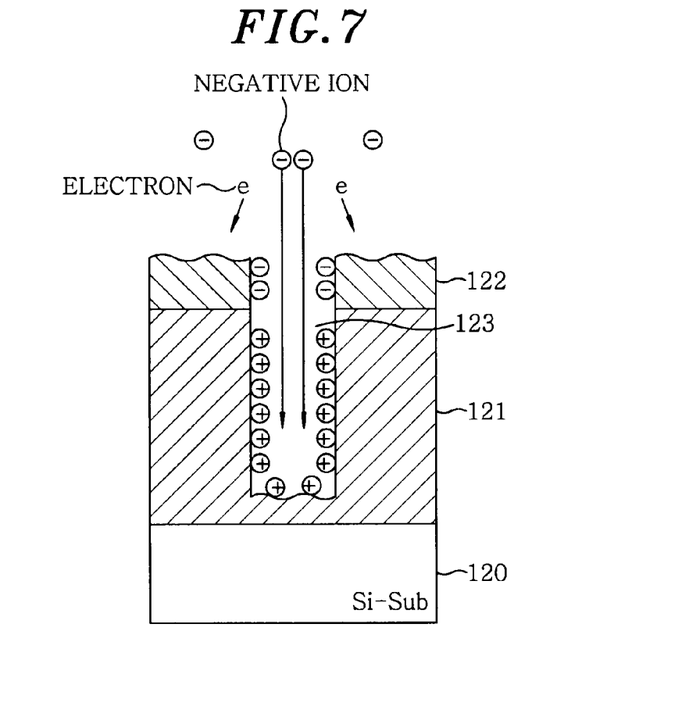
FIG. 7 illustrates a state when the first RF power supply for plasma generation is turned off in the second step.
Figure 8:
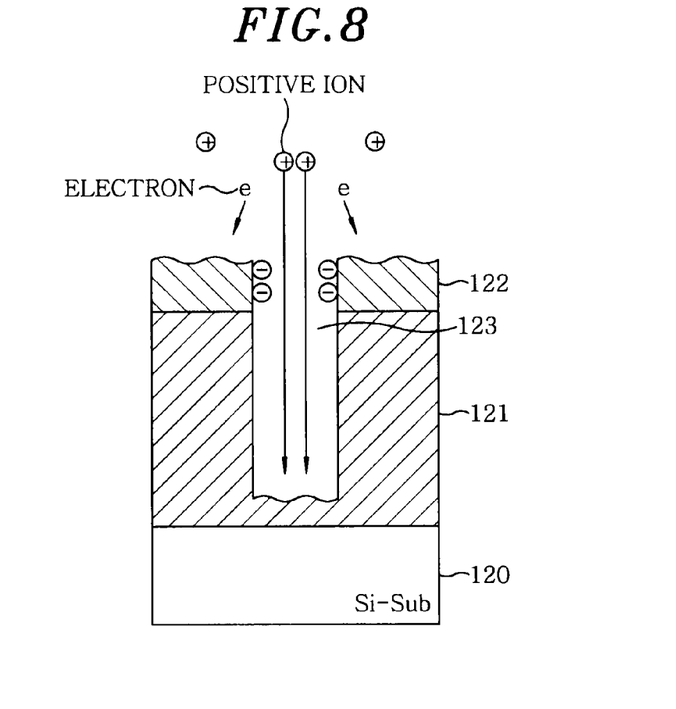
FIG. 8 illustrates a state when the first RF power supply for plasma generation is turned on in the second step.

FIG. 6 illustrates states of the variable DC power supply 50, the first RF power supply 48, plasma emission intensity, positive ions and negative ions in the second step. As shown in FIG. 6, in the second step, when the first RF power supply 48 is turned off, the plasma emission intensity is reduced and the plasma is extinguished. As the plasma emission intensity is reduced, the positive ions decrease and the negative ions increase due to remaining electrons. Since a minus DC voltage is applied to the upper electrode 34, as shown in FIG. 7, negative ions present in the processing space between the electrodes are forced into the contact hole 123 by the DC voltage to neutralize the positive charges in the contact hole 123. Then, when the first RF power supply 48 is turned on, the positive charges in the contact hole 123 decrease and, thus, the positive ions can go straight in the contact hole 123 as shown in FIG. 8.

Therefore, as described above, while a negative DC voltage is applied to the upper electrode 34, the first RF power supply 48 is alternately turned on and off to alternately form a plasma on regime in which positive ions act as dominant ions and a plasma off regime in which negative ions act as dominant ions. Accordingly, it is possible to prevent the travel direction of the positive ions from being bent in the contact hole 123 and a good etching shape can be achieved, thereby increasing the etching rate.

In this case, preferably, the first RF power supply 48 for plasma generation is turned off for a period of time ranging from 10 µsec to 50 µsec. When the turn-off time period of the first RF power supply 48 is 10 µsec or more, positive ions can decrease and negative ions can increase. However, if the turn-off time period exceeds 50 µsec, etching time is reduced and it is not effective.

In the second step, preferably, the output of the second RF power supply 90 for bias application is changed in synchronization with the on/off operation of the first RF power supply 48. Specifically, (1) while the plasma is extinguished by turning off the first RF power supply 48, the second RF power supply 90 is turned off or the output thereof is reduced for a specific period. Further, (2) in addition to (1), while the plasma is generated by turning on the first RF power supply 48, the second RF power supply 90 is turned off or the output thereof is reduced for a specific period.

Figure 9A:
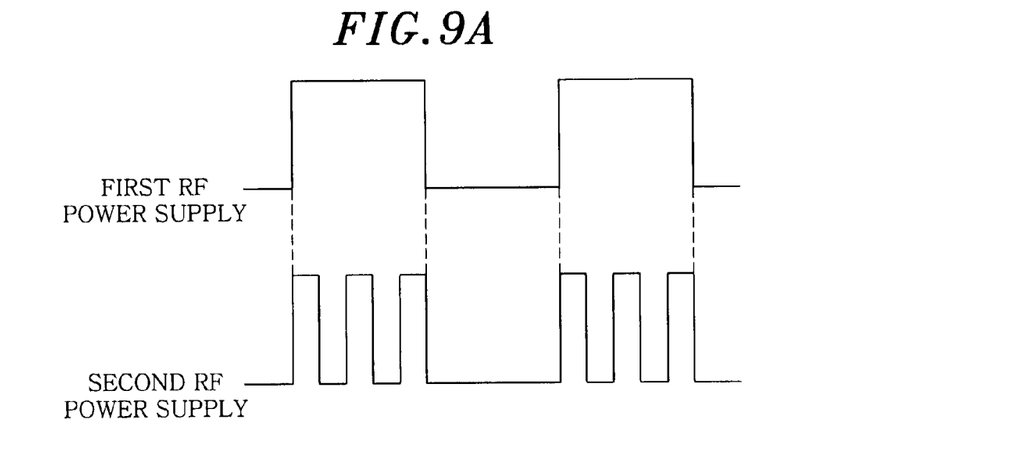
FIGS. 9A to 9C illustrate cases in which the second RF power for bias application is preferably applied in the second step of the plasma etching method in accordance with the embodiment of the present invention.
Figure 9B:
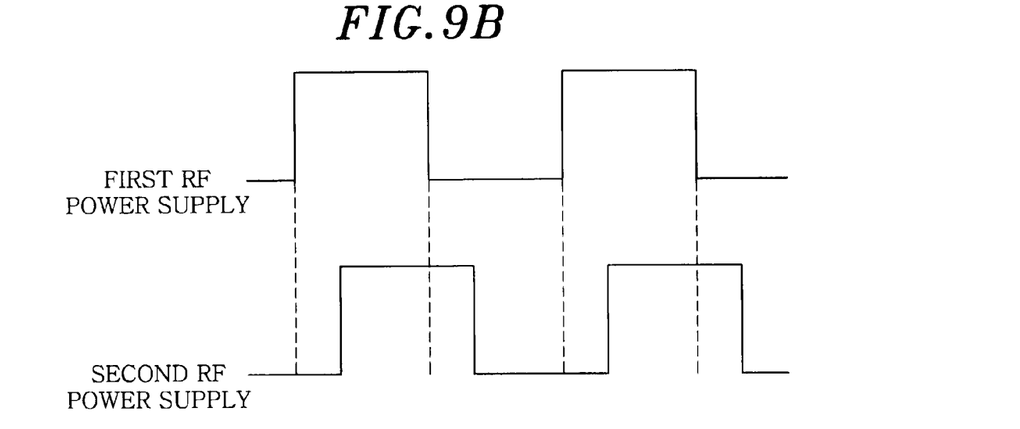
Figure 9C:
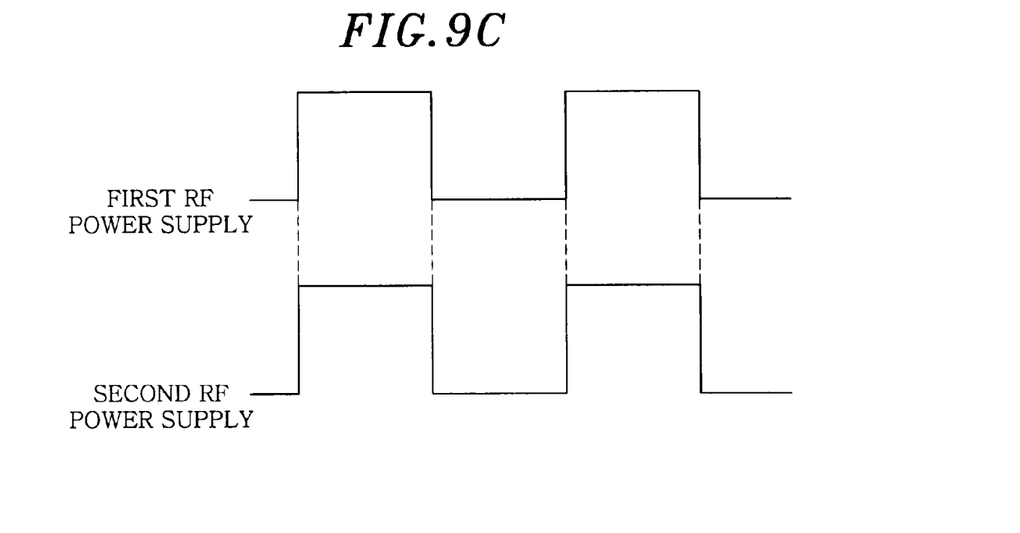

FIGS. 9A and 9B illustrate examples of the sequence satisfying (1) and (2). In the sequence of FIG. 9A, while the plasma is extinguished by turning off the first RF power supply 48 for plasma generation, the second RF power supply 90 is turned off or controlled to have an output lower than the output of the first step. Further, while the plasma is generated by turning on the first RF power supply 48, the second RF power supply 90 for bias application is controlled to alternately have a first output equal to the output of the first step and an output of zero (off) or a second output lower than the output of the first step. In the sequence of FIG. 9B, the first output and the second output of the second RF power supply 90 are shifted to each other in a cycle equal to the on/off cycle of the first RF power supply 48, and the outputs of the first RF power supply 48 and the second RF power supply 90 are shifted at different timings. FIG. 9C illustrates an example of the sequence satisfying only (1), in which the first output and the second output of the second RF power supply 90 are shifted at timings equal to the on/off timings of the first RF power supply 48.

As a further explanation of (1), while the plasma is extinguished by turning off the first RF power supply 48, if the second RF power supply 90 has the first output, a plasma sheath having a considerable thickness remains on the susceptor 16 serving as the lower electrode and the plasma sheath serves as a barrier of negative ions. Accordingly, while the plasma is extinguished, the second RF power supply 90 is turned off or controlled to have the second output to eliminate the plasma sheath or reduce thickness of the plasma sheath such that the barrier substantially disappears. Thus, it is possible to increase the effect obtained by turning on and off the first RF power supply 48.

Figure 10A:
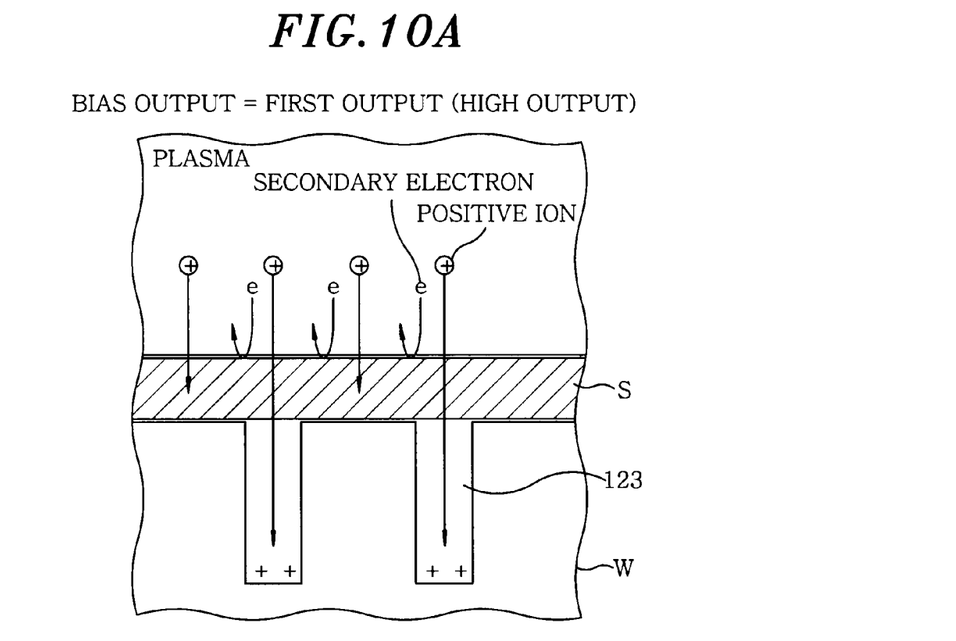
FIGS. 10A and 10B are diagrams for explaining the effect obtained by turning on and off the RF power for bias application when the plasma is generated.

Meanwhile, a further explanation of (2) is as follows. While the plasma is generated by turning on the first RF power supply 48, a minus DC voltage is applied to the upper electrode 34 such that the positive ions in the plasma collide with the upper electrode 34 to produce secondary electrons. The secondary electrons are accelerated vertically downward. If the second RF power supply 90 for bias application has the first output, as shown in FIG. 10A, a thick plasma sheath S is formed on the susceptor 16 serving as the lower electrode and, thus, less secondary electrons reach the inside of the contact hole 123 due to the plasma sheath S serving as a barrier of the secondary electrons.

Figure 10B:
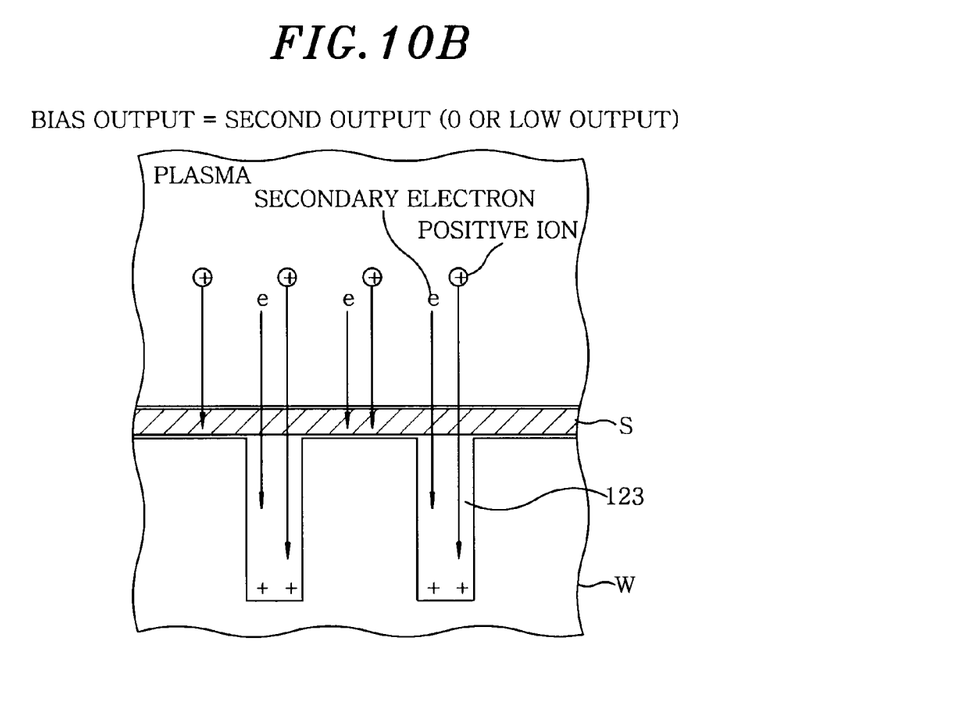

On the contrary, if the second RF power supply 90 for bias application has an output of zero or the second output lower than the first output, as shown in FIG. 10B, the thickness of the plasma sheath S is reduced and the barrier of the secondary electrons becomes smaller. Accordingly, the secondary electrons accelerated vertically downward by the DC voltage applied to the upper electrode 34 can effectively reach the inside of the contact hole 123 to neutralize the positive ions in the contact hole 123. Thus, it is possible to further increase the effect obtained by turning on and off the first RF power supply 48.

Figure 11A:
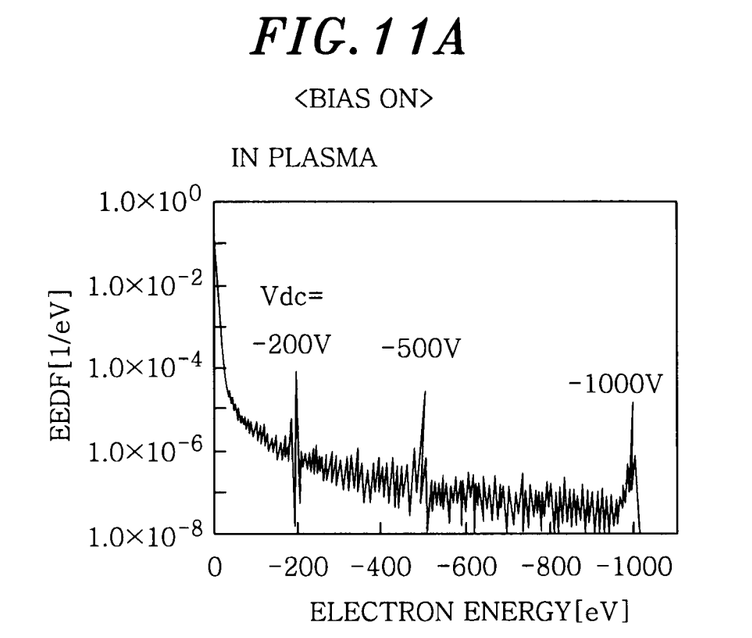
FIGS. 11A and 11B respectively illustrate electron energy in the plasma and on the wafer surface when an RF bias is applied in the plasma generation.
Figure 11B:
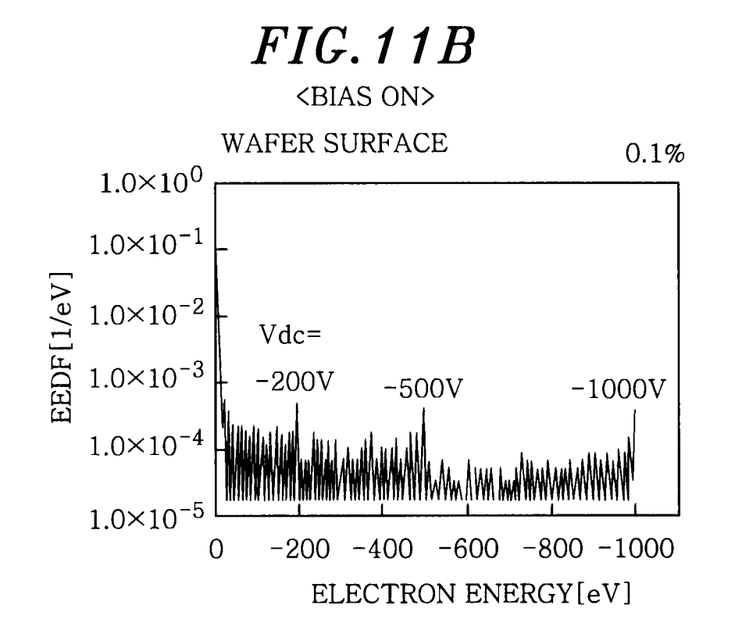
Figure 12A:
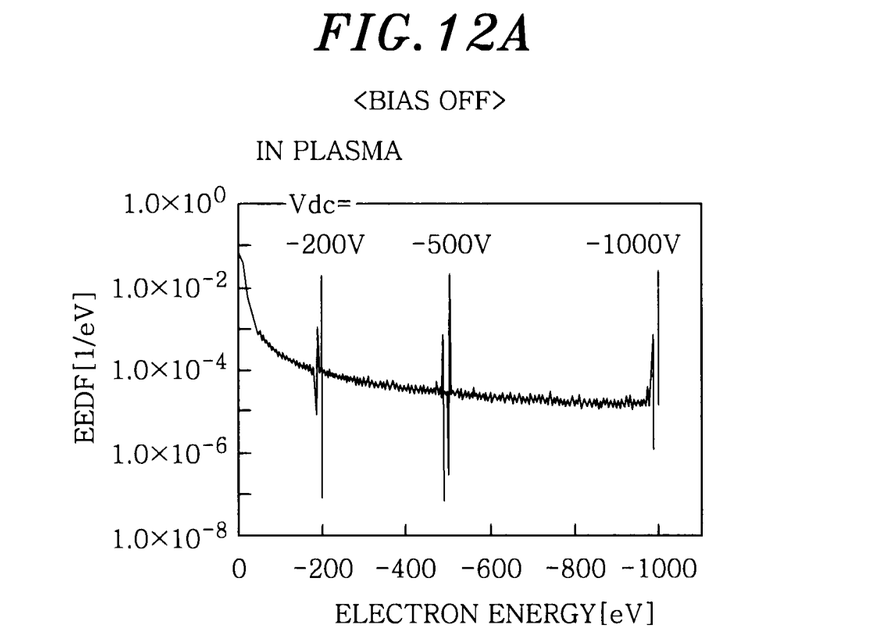
FIGS. 12A and 12B respectively illustrate electron energy in the plasma and on the wafer surface when an RF bias is not applied in the plasma generation.
Figure 12B:
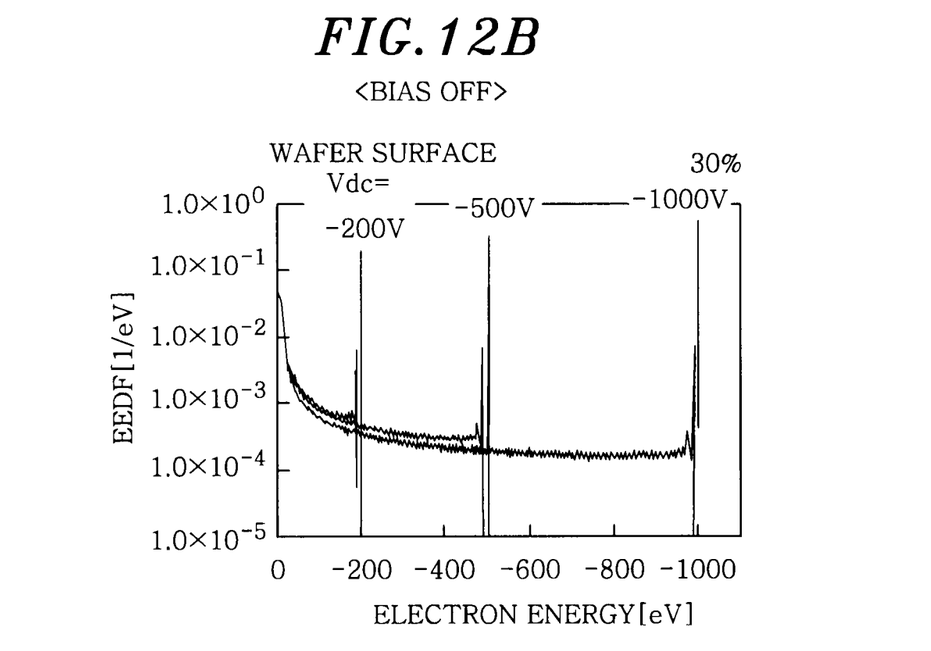

FIGS. 11A and 11B respectively illustrate electron energy in the plasma (15 mm above the wafer) and at the wafer surface when an RF bias (Vpp=1000 V) having a frequency of 2 MHz is applied. FIGS. 12A and 12B respectively illustrate electron energy in the plasma (15 mm above the wafer) and at the wafer surface when an RF bias is not applied. From FIGS. 11A to 12B, it can be seen that the barrier of the secondary electrons emitted from the upper electrode 34 and accelerated vertically downward by DC application is reduced by turning off the RF bias.

Further, the increase of the negative ions in the plasma-off state is not effectively achieved if the plasma is not completely extinguished. Accordingly, the DC voltage applied when the first RF power supply 48 is turned off is required not to contribute to generation of the plasma. Further, according to the sequence, an RF power from the second RF power supply 90 may be applied when the first RF power supply 48 is turned off. Also in this case, the RF power is required not to contribute to generation of the plasma. Further, the second output of the second RF power supply 90 for bias application may not be zero if the plasma sheath has a thickness enough to allow the secondary electrons to pass therethrough. However, preferably, the second output of the second RF power supply 90 is zero.

Figure 13:
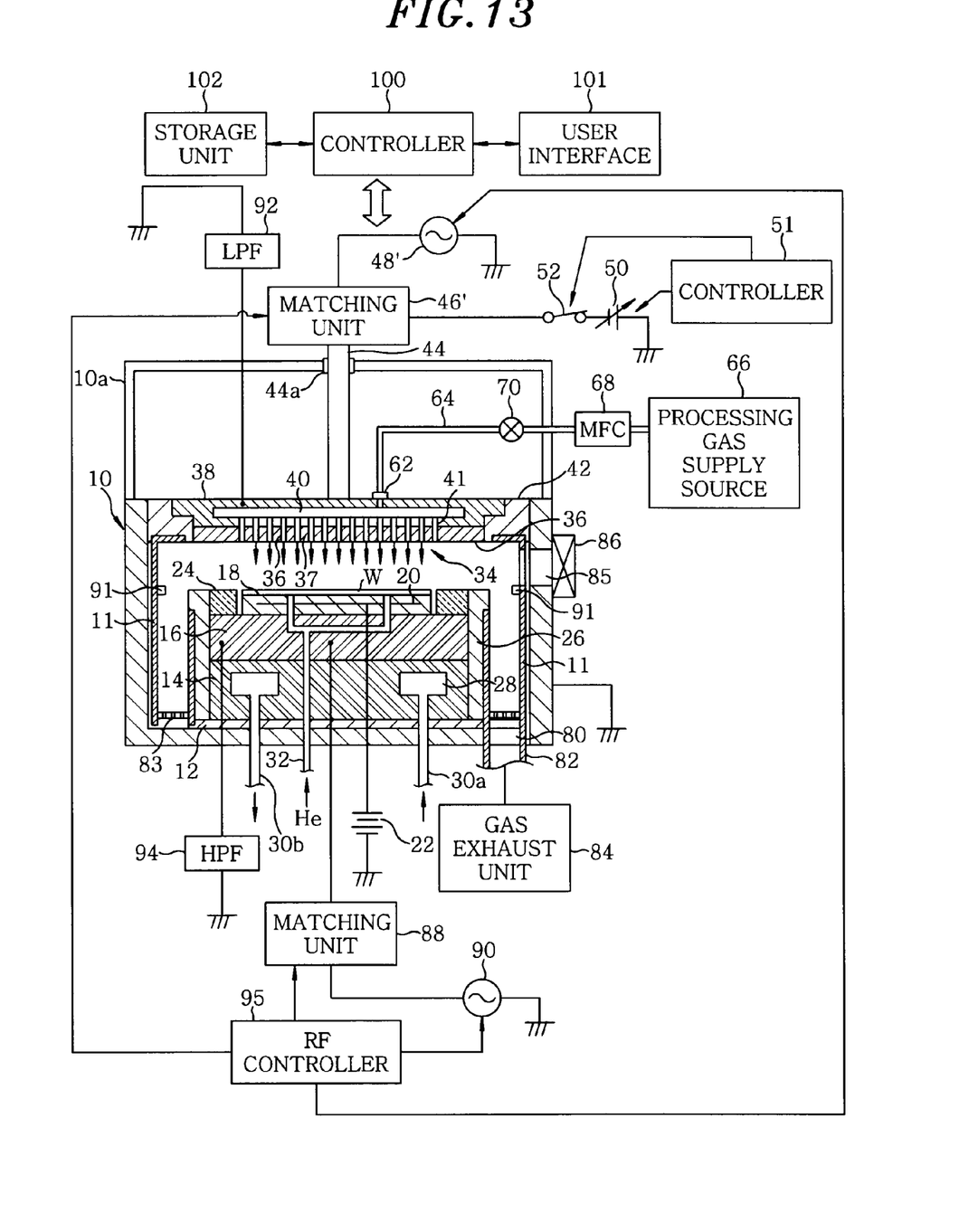
FIG. 13 schematically shows a cross sectional view of a plasma etching apparatus in accordance with a second embodiment of the present invention.

Hereinafter, a plasma etching apparatus in accordance with a second embodiment of the present invention will be described. FIG. 13 schematically shows a cross sectional view of the plasma etching apparatus in accordance with the second embodiment of the present invention.

This plasma etching apparatus is different from the apparatus of FIG. 1 in that an RF power for plasma generation is applied to an upper electrode. However, the plasma etching apparatus of the second embodiment basically has the same configuration as that of the plasma etching apparatus of the first embodiment. Thus, the same reference numerals will be given to the same parts, and a description thereof will be omitted.

In this embodiment, a first RF power supply 48' for plasma generation is connected to an upper electrode 34 through a first matching unit 46' and a power feed rod 44. The first RF power supply 48' has the same function as the first RF power supply 48 of the first embodiment and preferably has a frequency range of 27 to 100 MHz. The first matching unit 46' matches a load impedance to an internal (or output) impedance of the first RF power supply 48'. The first matching unit 46' serves to render the output impedance of the first RF power supply 48' and the load impedance be seemingly matched to each other when a plasma is generated in a chamber 10. An external terminal of the first matching unit 46' is connected to an upper end of the power feed rod 44. Further, a variable DC power supply 50 is also connected to the upper electrode 34 through the first matching unit 46' and the power feed rod 44.

Figure 14:
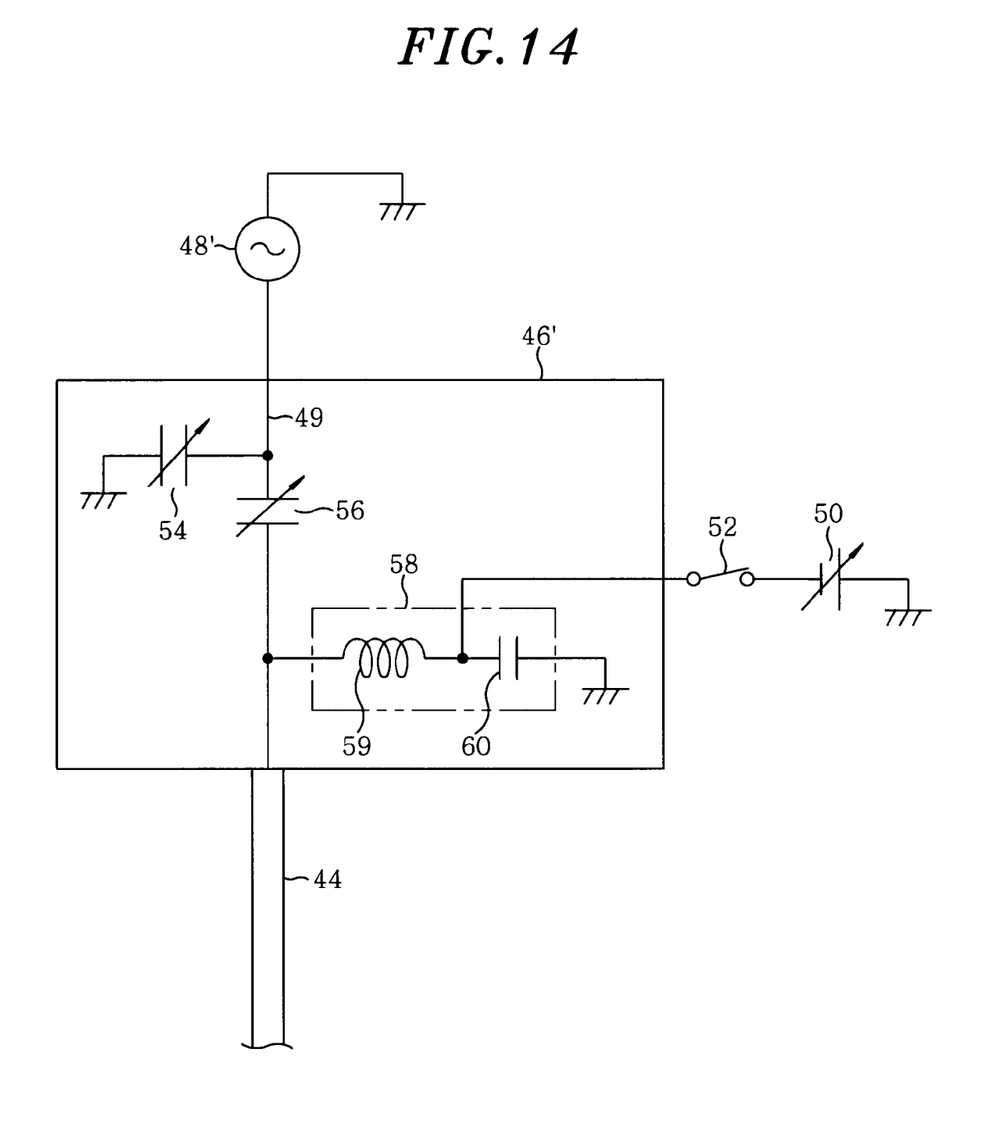
FIG. 14 illustrates a first matching unit connected to a first RF power supply in the plasma etching apparatus of FIG. 13.

The first matching unit 46' includes, as shown in FIG. 14, a first variable capacitor 54 provided in a line branched off from a power feed line 49 of the first RF power supply 48' and a second variable capacitor 56 arranged at the downstream side of the branch point in the power feed line 49 to exhibit the above-mentioned function. Further, the first matching unit 46' is provided with a filter 58 for trapping an RF power (e.g., 40 MHz) from the first RF power supply 48' and an RF power (e.g., 3 MHz) from a second RF power supply 90 to effectively supply DC voltage/current (hereinafter, referred to as "DC voltage") to the upper electrode 34. That is, the DC current from the variable DC power supply 50 flows into the power feed line 49 through the filter 58. The filter 58 includes a coil 59 and a capacitor 60, which serve to trap the RF power from the first RF power supply 48' and the RF power from the second RF power supply 90. Further, a cylindrical insulating member 44a is provided between a top wall of a cylindrical ground conductor 10a and the power feed rod 44. Accordingly, the power feed rod 44 and the ground conductor 10a are electrically insulated from each other.

The upper electrode 34 is electrically connected to a low pass filter (LPF) 92 for passing an RF power (e.g., 3 MHz) from the second RF power supply 90 to the ground without passing the RF power (e.g., 40 MHz) from the first RF power supply 48'. The low pass filter (LPF) 92 preferably includes an LR filter or an LC filter. Alternatively, the low pass filter (LPF) 92 may include only one conducting wire providing a sufficiently large reactance to the RF power (60 MHz) from the first RF power supply 48'. Meanwhile, the susceptor 16 is electrically connected to a high pass filter (HPF) 94 for passing an RF power (e.g., 40 MHz) from the first RF power supply 48' to the ground.

Also in the plasma etching apparatus of FIG. 13, the first RF power supply 48' for plasma generation is turned on and off while a DC voltage is applied to the upper electrode 34. Accordingly, the positive charges in the contact hole are neutralized with the negative ions in a plasma-off state and, thus, the positive ions can go straight in a plasma-on state. Further, the positive charges in the contact hole can be neutralized with the secondary electrons by varying the output of the second RF power supply 90 for bias application.

In the apparatus of FIG. 13, a first RF power for plasma generation is supplied to the upper electrode 34 and a second RF power for ion attraction is supplied to the susceptor 16 serving as the lower electrode. Accordingly, controllability of the plasma can be improved. Further, an RF power having a high frequency equal to or greater than 27 MHz is supplied to the upper electrode 34. Accordingly, the plasma can be formed in high density in a desired state and a high density plasma can be generated under low pressure conditions.

However, when an RF power for plasma generation is applied to the upper electrode, the plasma is formed in the vicinity thereof and, thus, it is relatively difficult to increase the etching rate on the wafer under the conditions that the inner pressure of the chamber 10 is high and the plasma density is low.

Further, in the embodiments, the first RF power can have a frequency of, e.g., 27 MHz, 40 MHz, 60 MHz, 80 MHz and 100 MHz and the second RF power can have a frequency of, e.g., 400 kHz, 800 kHz, 1 MHz, 2 MHz, 3 MHz, 13 MHz and 13.6 MHz. The frequencies of the first and second RF powers may be appropriately selected according to the process.

While the invention has been shown and described with respect to the embodiments, it will be understood by those skilled in the art that various changes and modification may be made without being limited thereto. For example, although the plasma etching process includes the first step of continuously applying an RF power for plasma generation while a DC voltage is applied to the upper electrode 34 and the second step of turning on and off the RF power for plasma generation while a DC voltage is applied to the upper electrode 34 in the above embodiments, the plasma etching process may include only the second step. Further, an object to be processed, to which the present invention is applied, is not limited to the semiconductor wafer shown in FIG. 3, and may have a structure in which an anti-reflection film or a hard mask is interposed between a photoresist and an etching target film. The etching target film is generally an insulating film, but it is not limited thereto.

In accordance with the embodiments of the present invention, a first condition that a plasma is generated in the processing chamber by turning on the first RF power supply and a minus DC voltage is applied to the upper electrode from the DC power supply and a second condition that the plasma is extinguished in the processing chamber by turning off the first RF power supply and a minus DC voltage is applied to the upper electrode from the DC power supply are alternately repeated. An etching process is performed by positive ions in the plasma under the first condition and negative ions are produced and supplied into the hole by the DC voltage to neutralize positive ions in the hole under the second condition. When the plasma is generated under the first condition after the positive ions in the hole are neutralized with negative ions under the second condition, the positive ions can go straight in the hole without being turned. Accordingly, a good etching shape can be achieved, and it is possible to prevent a reduction in etching rate due to the aspect ratio increased as the etching proceeds.

While the invention has been shown and described with respect to the embodiments, it will be understood by those skilled in the art that various changes and modification may be made without departing from the scope of the invention as defined in the following claims.

What is claimed is:

1. A plasma etching method for forming a hole in an etching target film by using a plasma processing apparatus, which includes a vacuum evacuable processing chamber accommodating an object to be processed, a lower electrode disposed in the processing chamber and serving as a mounting table on which the object is mounted, an upper electrode disposed in the processing chamber to face the lower electrode, a processing gas supply unit for supplying a processing gas into the processing chamber, an RF power supply for applying an RF power for plasma generation to at least one of the upper electrode or the lower electrode, and a DC power supply for applying a minus DC voltage to the upper electrode, the method comprising:
   alternately repeating a first process and a second process, wherein in the first process a plasma is generated in the processing chamber by turning on the RF power supply and the minus DC voltage is applied to the upper electrode from the DC power supply, and in the second process the RF power supply is turned off and the minus DC voltage is applied to the upper electrode from the DC power supply,
   wherein, during the second process, a plasma sheath remains formed on the lower electrode by plasma generated in the first process, and wherein the method further includes reducing a thickness of the plasma sheath during the second process, and
   wherein an etching process is performed by positive ions in the plasma during the first process and negative ions are produced and supplied into the hole by the DC voltage to neutralize positive ions in the hole during the second process, thereby suppressing bending of travel direction of the positive ions in the hole during the etching process.

2. The plasma etching method of claim 1, wherein the plasma etching apparatus further includes a biasing RF power supply for applying additional RF power for bias application to the lower electrode, and
   wherein an output of the biasing RF power supply is changed in synchronization with the on/off operation of the RF power supply, and the biasing RF power supply is turned off or the output of the biasing RF power supply is reduced for a specific period during the second process.

3. The plasma etching method of claim 2, wherein the biasing RF power supply is turned off or the output is reduced for a specific period while the plasma is generated by turning on the RF power supply.

4. The plasma etching method of claim 3, wherein the minus DC voltage is applied continuously to the upper electrode from the DC power supply while the first process and the second process are alternately repeated.

5. The plasma etching method of claim 2, wherein the biasing RF power supply is turned off or the output of the biasing RF power supply is reduced for the specific period during the first process.

6. The plasma etching method of claim 5, wherein the minus DC voltage is applied continuously to the upper electrode from the DC power supply while the first process and the second process are alternately repeated.

7. The plasma etching method of claim 2, wherein the minus DC voltage is applied continuously to the upper electrode from the DC power supply while the first process and the second process are alternately repeated.

8. The plasma etching method of claim 1, wherein a duration of a cycle of the second process ranges from 10 μsec to 50 μsec.

9. The plasma etching method of claim 1, wherein the first process and the second process are repeated in a pulse shape.

10. The plasma etching method of claim 1, wherein the etching target film of the object is an insulating film.

11. The plasma etching method of claim 1, wherein the minus DC voltage is applied continuously to the upper electrode from the DC power supply while the first process and the second process are alternately repeated.

12. A plasma etching method for forming a hole in an etching target film by using a plasma processing apparatus, which includes a vacuum evacuable processing chamber accommodating an object to be processed, a lower electrode disposed in the processing chamber and serving as a mounting table on which the object is mounted, an upper electrode disposed in the processing chamber to face the lower electrode, a processing gas supply unit for supplying a processing gas into the processing chamber, an RF power supply for applying an RF power for plasma generation to at least one of the upper electrode or the lower electrode, and a DC power supply for applying a minus DC voltage to the upper electrode, the method comprising:
   a first step of continuously supplying the RF power from the RF power supply to generate a plasma in the processing chamber and applying the minus DC voltage to the upper electrode from the DC power supply;
   a second step of alternately repeating a first process and a second process, wherein in the first process a plasma is generated in the processing chamber by turning on the RF power supply and the minus DC voltage is applied to the upper electrode from the DC power supply, and in the second process the RF power supply is turned off and the minus DC voltage is applied to the upper electrode from the DC power supply,
   wherein, during the second process, a plasma sheath remains formed on the lower electrode by plasma generated in the first process, and wherein the method further includes reducing a thickness of the plasma sheath during the second process, and
   wherein, in the second step, an etching process is performed by positive ions in the plasma during the first process and negative ions are produced and supplied into the hole by the DC voltage to neutralize positive ions in the hole during the second process, thereby suppressing bending of travel direction of the positive ions in the hole during the etching process.

13. The plasma etching method of claim 12, wherein the plasma etching apparatus further includes a biasing RF power supply for applying additional RF power for bias application to the lower electrode,
   wherein in the first step, a bias is continuously applied at a first output from the biasing RF power supply, and
   wherein, in the second step, an output of the biasing RF power supply is changed in synchronization with the on/off operation of the RF power supply, and the biasing RF power supply is turned off or has a second output lower than the first output for a specific period during the second process.

14. The plasma etching method of claim 13, wherein in the second step, the biasing RF power supply is turned off or has the second output lower than the first output for the specific period while the plasma is generated by turning on the RF power supply.

15. The plasma etching method of claim 14, wherein the minus DC voltage is applied continuously to the upper electrode from the DC power supply while the first process and the second process are alternately repeated.

16. The plasma etching method of claim 13, wherein the biasing RF power supply is turned off or the second output of the biasing RF power supply is reduced for the specific period during the first process.

17. The plasma etching method of claim 16, wherein the minus DC voltage is applied continuously to the upper electrode from the DC power supply while the first process and the second process are alternately repeated.

18. The plasma etching method of claim 13, wherein the minus DC voltage is applied continuously to the upper electrode from the DC power supply while the first process and the second process are alternately repeated.

19. The plasma etching method of claim 12, wherein the minus DC voltage is applied continuously to the upper electrode from the DC power supply while the first process and the second process are alternately repeated.

* * * * *